United States Patent [19]

Simpson et al.

[11] Patent Number: 4,891,014

[45] Date of Patent: Jan. 2, 1990

[54] METHOD OF FORMING CONTACT BUMPS IN CONTACT PADS

[75] Inventors: Scott S. Simpson; Bruce G. Kosa, both of Woodstock, Conn.

[73] Assignee: Rogers Corporation, Rogers, Conn.

[21] Appl. No.: 319,130

[22] Filed: Mar. 3, 1989

[51] Int. Cl.⁴ .............................................. H01R 9/07
[52] U.S. Cl. ........................................ 439/67; 29/846; 29/884
[58] Field of Search ...................... 439/55, 67, 77, 492, 439/493, 495; 29/846, 884, 825; 361/398, 406

[56] References Cited

U.S. PATENT DOCUMENTS

| | | | |
|---|---|---|---|
| 3,289,141 | 11/1966 | White | 439/74 |
| 3,881,799 | 5/1975 | Elliott et al. | 439/816 |
| 4,116,517 | 9/1978 | Selvin et al. | 439/67 |
| 4,184,729 | 1/1980 | Parks et al. | 439/66 |
| 4,403,272 | 9/1983 | Larson et al. | 361/398 |
| 4,420,203 | 12/1983 | Aug et al. | 439/71 |
| 4,548,451 | 10/1985 | Benarr et al. | 439/66 |
| 4,835,859 | 6/1989 | Beckett | 29/846 |

*Primary Examiner*—Neil Abrams
*Attorney, Agent, or Firm*—Fish & Richardson

[57] ABSTRACT

A process for forming a contact bump in an electrically conductive contact pad having top and bottom surfaces supported on a dielectric substrate that includes the steps of removing a portion of the substrate underlying the contact pad to form an aperture and expose a portion of the bottom surface of the pad; upwardly deforming the pad by applying force to its exposed bottom surface to form the bump; and filling the aperture behind the bump with a supporting substance.

14 Claims, 6 Drawing Sheets

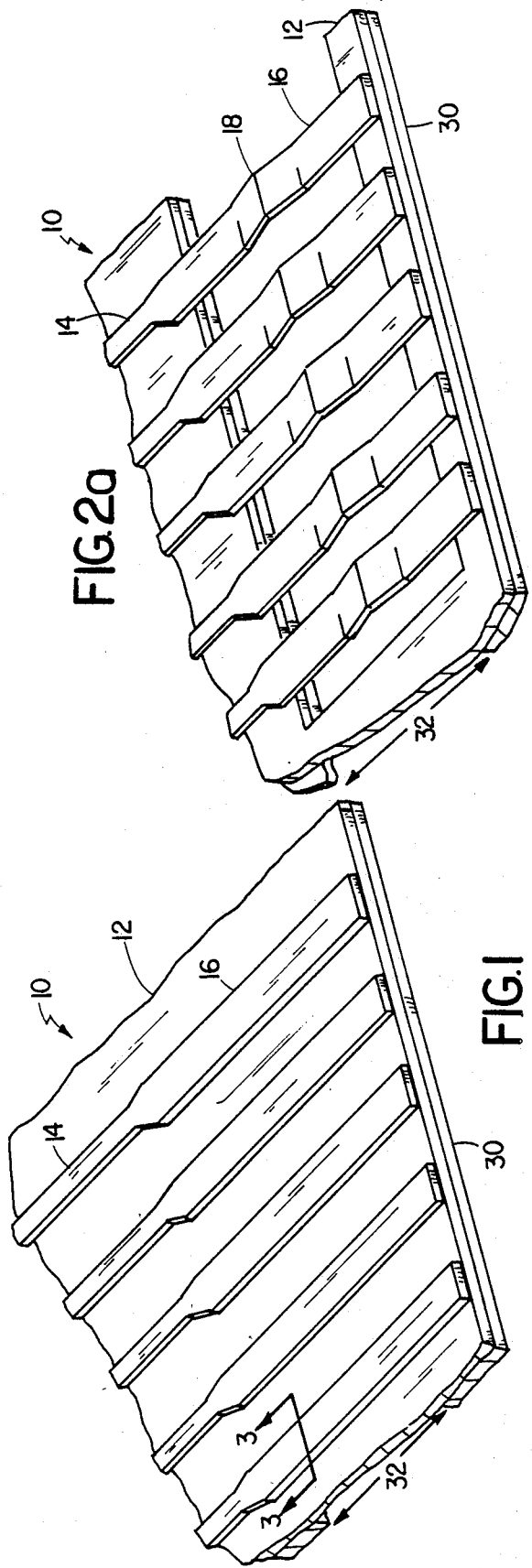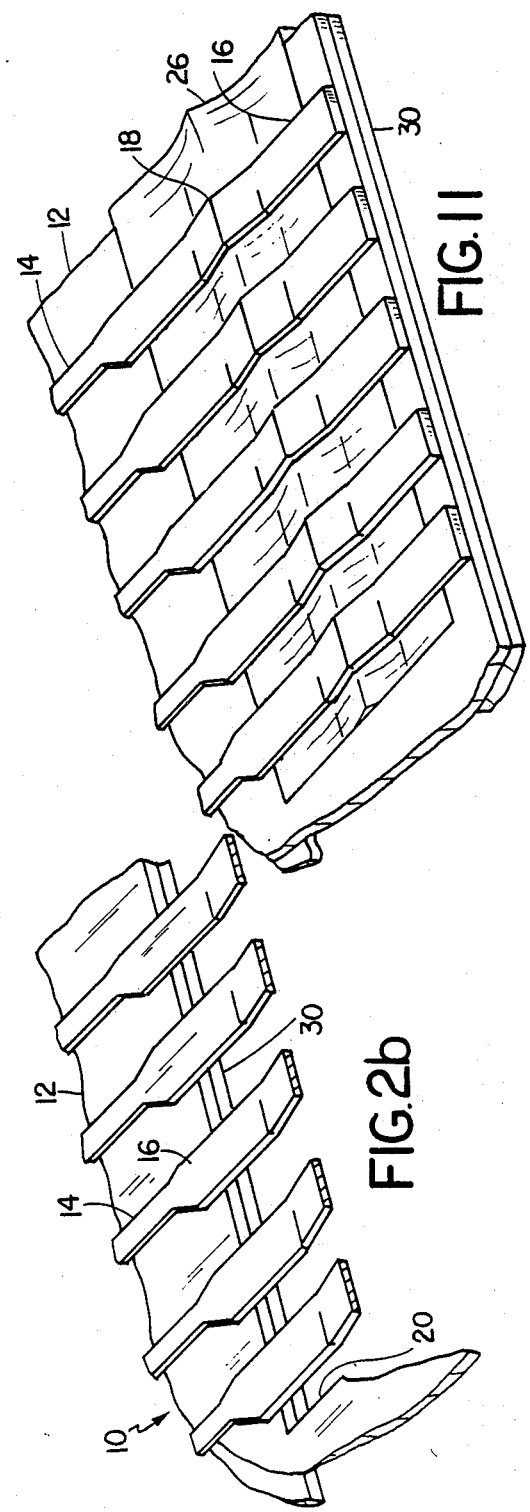

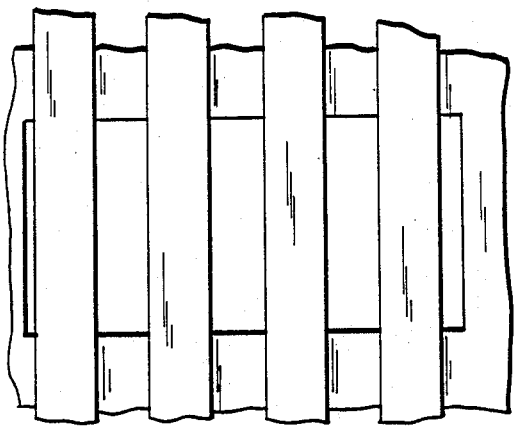
FIG.2c
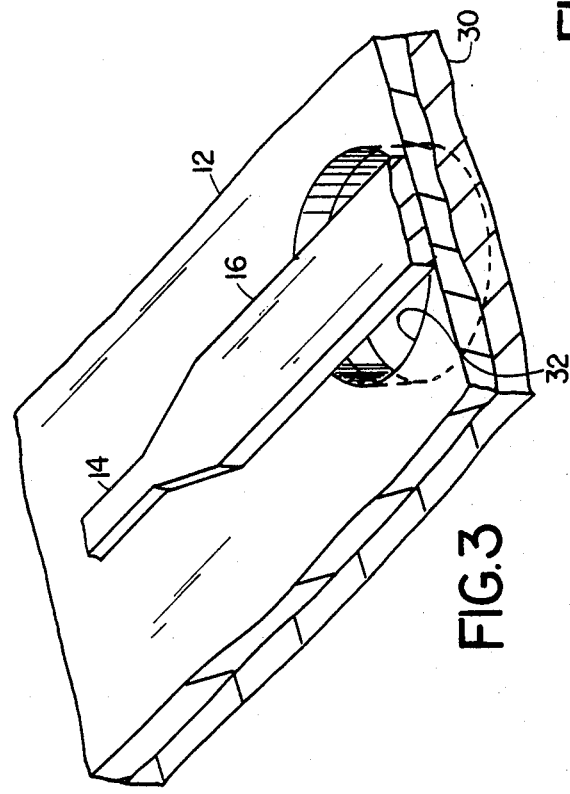
FIG.3
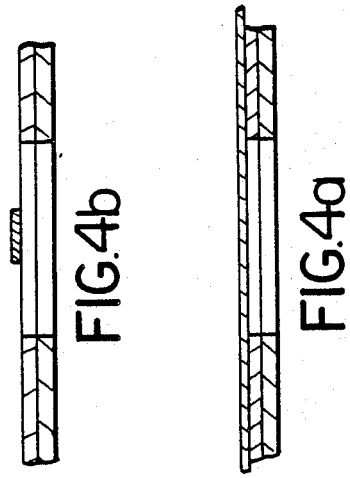
FIG.4b
FIG.4a
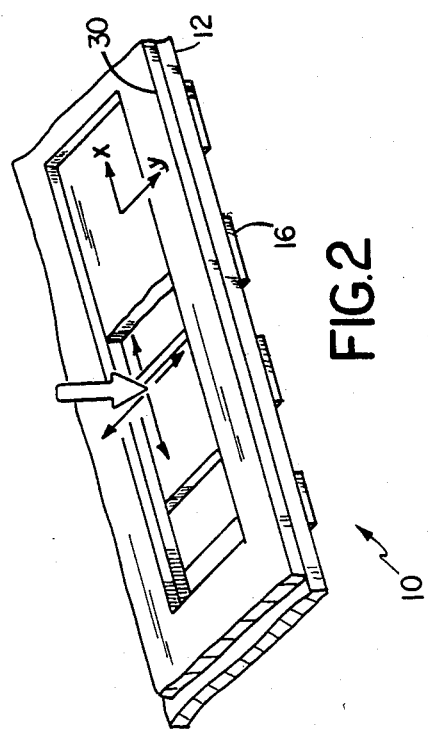
FIG.2
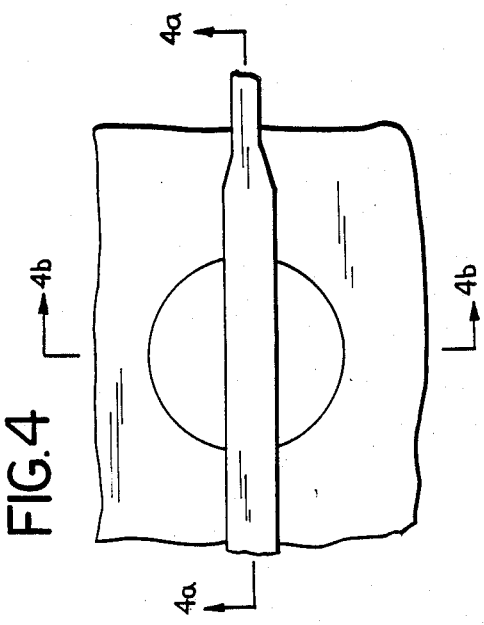
FIG.4

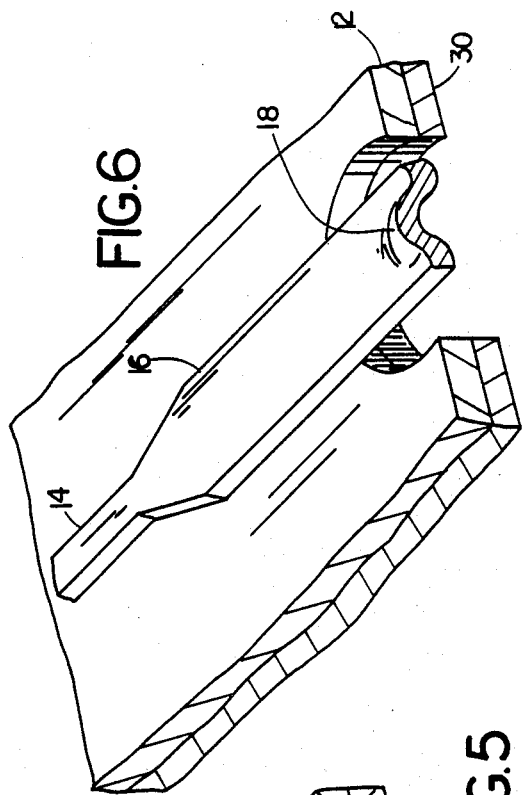
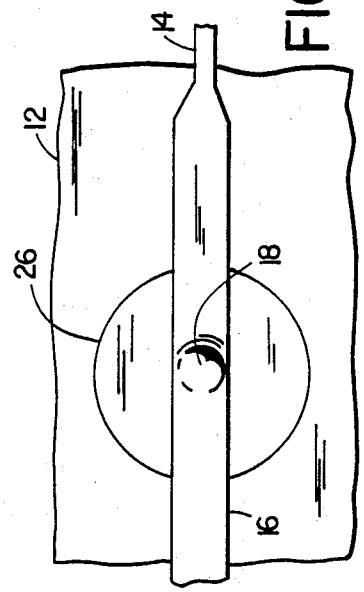
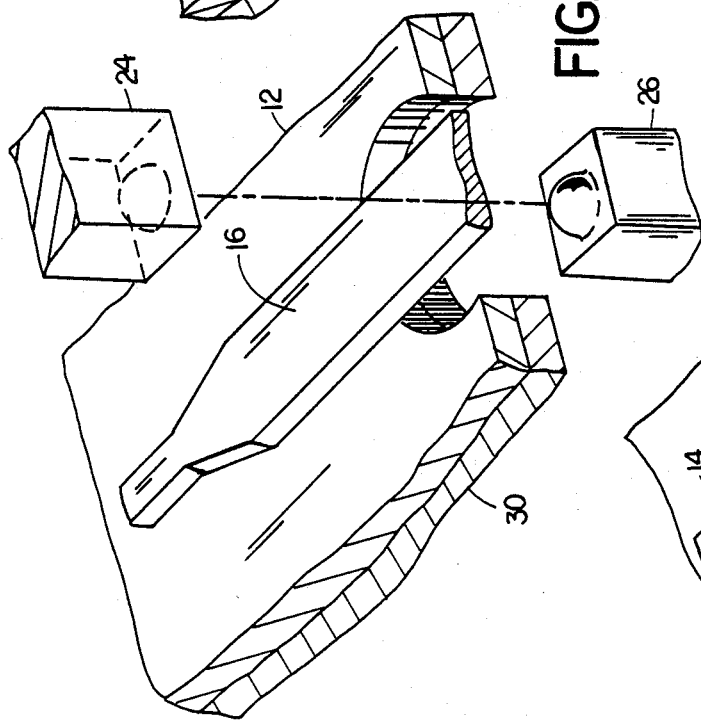
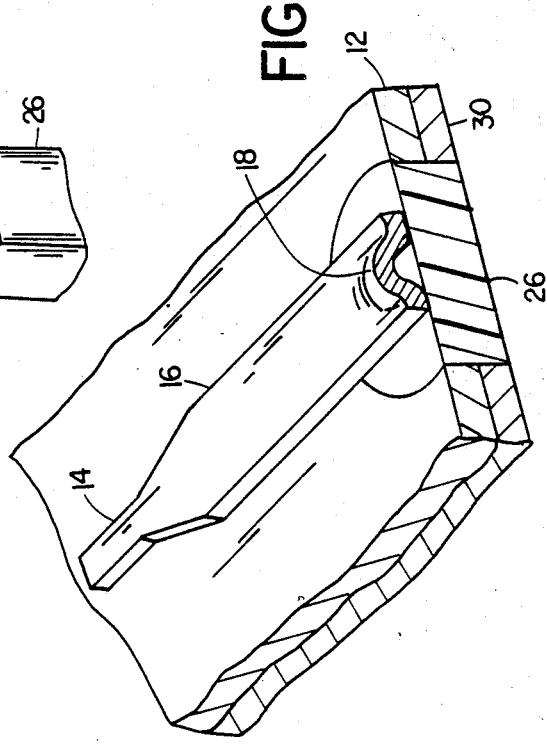

METHOD OF FORMING CONTACT BUMPS IN CONTACT PADS

BACKGROUND OF THE INVENTION

This invention relates to contact bumps on pads of printed circuits.

Contact bumps are often created to improve the localized contact force or sliding action between pads of printed circuits, especially where one of the circuits is a flexible printed circuit.

SUMMARY OF THE INVENTION

According to one aspect, the invention features a process for forming a contact bump in an electrically conductive contact pad having top and bottom surfaces supported on a dielectric substrate that includes the steps of (a) removing a portion of the substrate underlying the contact pad to form an aperture and thereby expose a portion of the bottom surface of the pad; (b) upwardly deforming the pad by applying force to its exposed bottom surface to form the bump in the pad itself; and (c) filling the aperture behind the bump with a supporting substance.

According to another aspect of the invention, the aperture is created by ablating the desired portion of the substrate with a laser, with the difference in interaction between the substrate being removed and the substance of the pad enabling the ablating process to leave the pad intact despite exposure to the laser beam.

In preferred embodiments, the aperture formed is preferably large relative to the pad size, extends through the entire thickness of the substrate on either side of the pad, and accommodates an impact forming tool; a patterned mask layer is preferably provided underneath the substrate for determining the location of the aperture. The bottom surface of the pad exposed following formation of the aperture is preferably stamped with a stamping die to form the bump. The aperture is preferably filled by dropping an adhesive or non-adhesive dielectric material (or both) in the aperture in such a manner to cause the material to fill the aperture. Another preferred way of filling the aperture involves laminating an adhesive-coated cover film to the substrate into or over the aperture and causing the adhesive to flow into the aperture.

The invention also features a contact bump prepared according to the above-described process, and a printed circuit (preferably a flexible printed circuit) that includes such bumps.

The invention provides a simple and inexpensive method for preparing contact bumps. The bumps can be formed in a wide variety of sizes and shapes. They resist collapsing under pressure because filling in the aperture behind each bump creates a stabilizing support. Furthermore, forming a hole and then deforming the contact pad directly to form the bump, rather than deforming the dielectric substrate, avoids cracking the dielectric substrate, or establishing conditions in which the presence or recovery of the dielectric substrate reduces the size or definition of the features of the bump. Thus, bumps having features that are too fine to be made when the bumps are formed with a dielectric underneath e.g., straighter sides, ridges on the top surface, or the like, can be prepared.

Other features and advantages of the invention will be apparent from the following description of the preferred embodiments thereof, and from the claims.

DESCRIPTION OF THE PREFERRED EMBODIMENTS

We first briefly describe the drawings.

FIG. 1 is a perspective view of a flexible circuit having a plurality of conductive traces terminating in contact pads.

FIG. 2 is a perspective view of the flexible circuit of FIG. 1 in an inverted position and depicting laser ablating action during the forming of an opening in the back side of the flexible circuit.

FIG. 2a is a perspective view of the circuit shown in FIG. 1 after the formation of contact bumps in the contact pads that have remained intact, while FIG. 2b is a broken away view of part of FIG. 2.

FIGS. 2c and 2d illustrate other steps involved in manufacturing the circuit shown in FIG. 2a.

Figure 8:
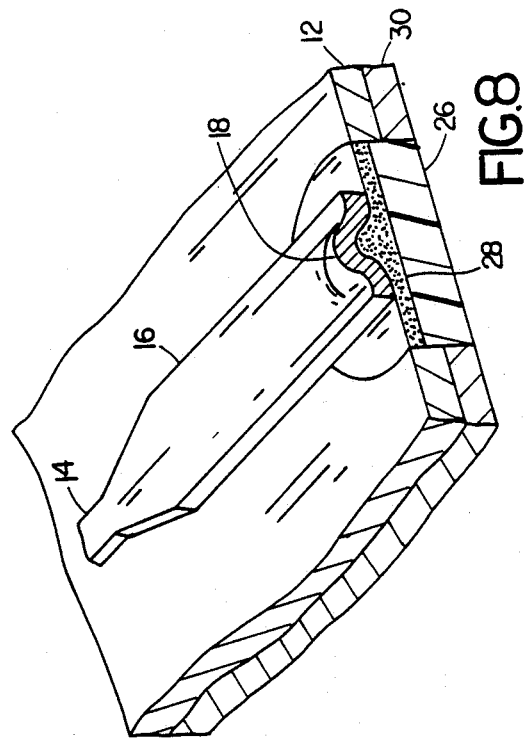

FIGS. 3, 4, 4a, 4b, 5, 6, 7, 7a, 8, 9, and 10 illustrate steps involved in forming a contact bump in a single contact pad.

FIG. 11 is a perspective view similar to FIG. 1 of the completed flexible printed circuit product.

Referring to FIG. 1, there is shown a flexible circuit 10 having a plurality of conductive traces 14 deposited on a flexible dielectric substrate 12; FIG. 3 shows an individual trace. Substrate 12 is preferably made of a polyimide such as Kapton. Its thickness ranges from 0.001 to 0.010 inch, and is typically about 0.003 inch. Conductive traces 14 are typically copper traces deposited by plating techniques, having widths of about 0.006 inch. Each trace 14 terminates in a rectangular contact pad 16. The width of pad 16 generally ranges from 0.005 to 0.050 inch, and is typically about 0.010 inch. The pitch (i.e. the center-to-center distance between contacts) is between 0.010 and 0.100 inch and is generally about 0.025 inch. The total length of trace 14, including pad 16, is between 0.025 and 0.150 inch, and is typically about 0.100 inch.

Contact bumps 18 (see also FIG. 11) are formed on top of contact pads 16 to improve the localized contact force when flexible circuit 10 is connected to a rigid circuit board or to another flexible circuit. Each bump 18 typically is about 0.005 inch high. The first step in forming bump 18 is to provide an aperture 20 in dielectric substrate 12 underlying pad 16. The width of aperture 20 is typically larger than the width of the pad, chosen to accomodate a stamping die that is inserted for forming bump 18; typically, the width is about 0.080 inch. Because traces 14 and their pads are often closely spaced, it is preferable to form aperture 20 as a single channel spanning all the pads, e.g., as shown in Figs. 2 et seq. rather than forming a separate opening for each trace.

Figure 2D:
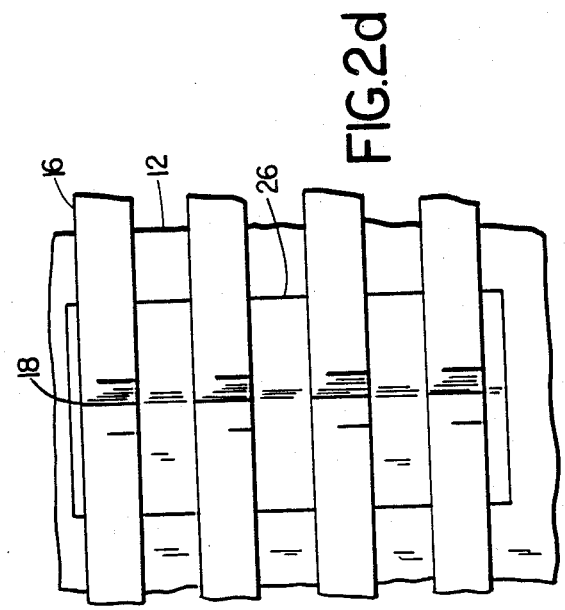

Aperture 20 is preferably formed by ablating the desired portion of substrate 12 with a laser, either by scanning the laser beam back and forth across the area to be ablated, as sugqested in FIG. 2, or by exposing the area to a laser of sufficiently high strength to ablate the area in a single dose. Flexible circuit 10 is preferably provided with a ground plane layer 30 underlying dielectric substrate 12 having an opening 32 formed by photo-resist techniques, positioned where aperture 20 is to be formed. Layer 30, which is typically copper, acts as a mask during the formation of aperture 20 because it reflects laser light; thus, only the portion of dielectric 12 exposed by opening 32 is ablated, assuring precise positioning of the aperture. A laser is selected of appropriate frequency and energy to have an ablating action on the substance of the substrate, but not to affect the pad, which for instance may reflect the laser rays or conduct away the deposited energy. By this ablating action, the substrate is entirely removed in the designated region, e.g., as determined by the pattern in printed copper layer 30, the backside of the flexible printed circuit. Thus, the copper pads freely bridge across the aperture at this stage, with open space between them, e.g., see also FIGS. 2 et seq. In this example, the aperture is 0.075 inch in the direction of the length of the pads and extends beneath a row of them.

Next, the male member 22 of a two-piece stamping die is inserted into aperture 20 immediately below the portion of pad 16 where bump 18 is to be formed, as shown in FIG. 5. Circuit 10 is held in this position with alignment pins (not shown). The female member 24 of the stamping die is then moved downwardly into mating contact with male member 22 to form bump 18. Preferably, contact bumps are formed simultaneously in a row of contact pads using a single two-piece stamping die assembly, as suggested in FIGS. 2 et seq. (a single pad with bump is shown in FIG. 6).

Once bump 18 has been formed, aperture 20 is filled with a supporting substance to prevent bump 18 from collapsing under pressure. Preferably, this is accomplished by inserting a pre-cut piece of a thermoformable dielectric 26, e.g., an acrylic-based adhesive, into aperture 20 and then heating circuit 10 to cause dielectric 26 to flow and fill aperture 20, as shown in FIGS. 7 et seq. after which it solidifies to form a strong support. Dielectric 26 may also be provided with a non-thermoformable material 28 (e.g., Kapton) to aid the filling-in process, FIG. 8.

Figure 9:
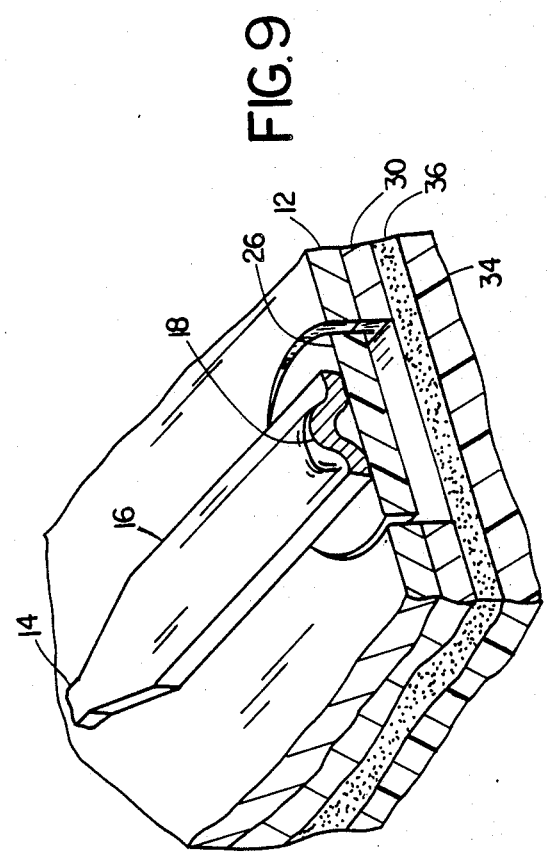
Figure 10:
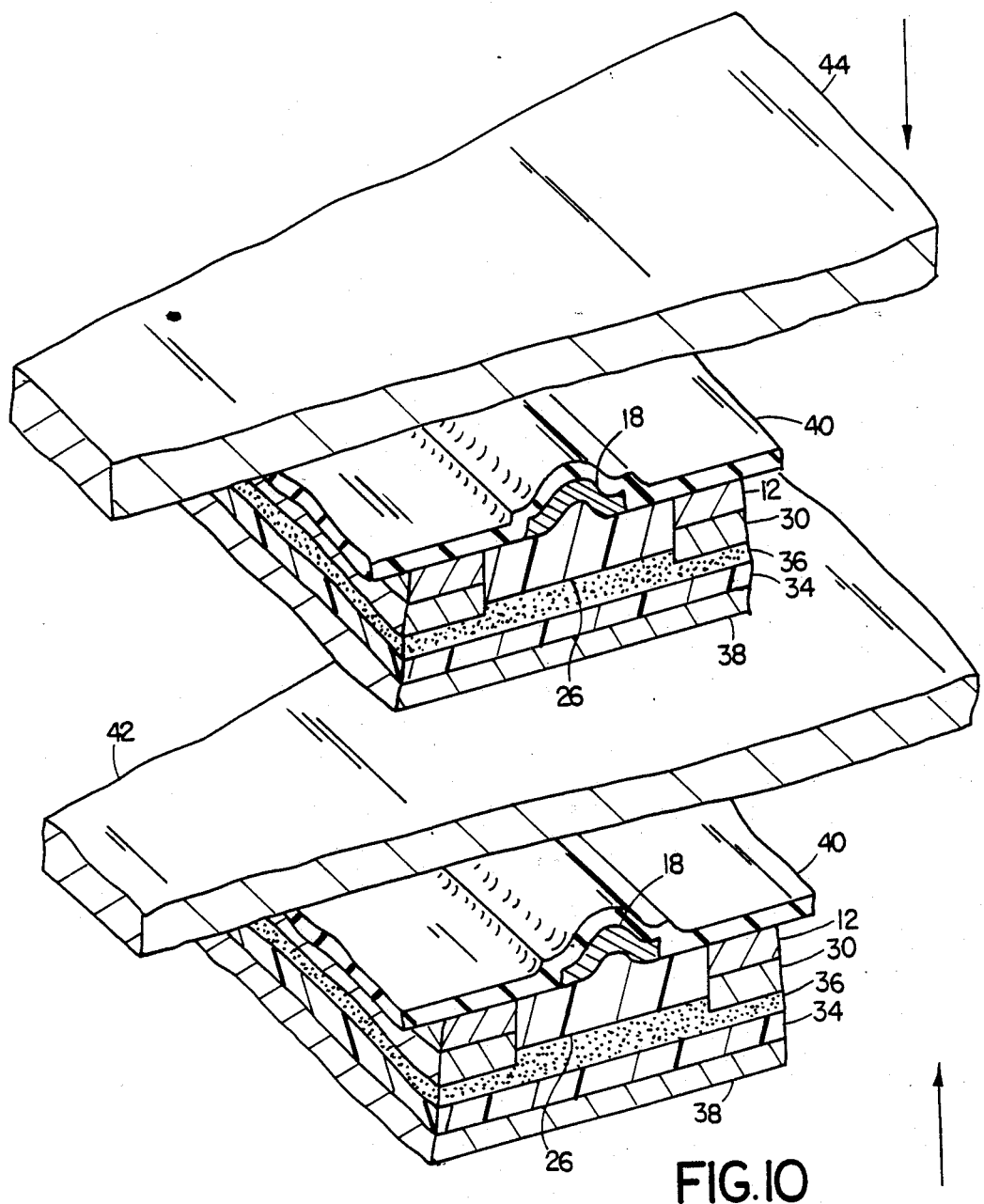

Referring to FIG. 9, aperture 20 may also be filled as follows. A piece of dielectric 26 is dropped in aperture 20, as described above. Next, a cover film 34 provided with a layer of adhesive 36 is placed in contact with ground plane layer 30. The entire structure is then laminated by applying heat and pressure, causing dielectric 26 and adhesive 36 to flow into openings 20 and 32 to fill them. Preferably, several flexible circuits undergo lamination simultaneously, as shown in FIG. 10. A release sheet 38 (typically paper or a plastic such as Tedlar) is placed underneath the cover film 34 of each flexible circuit assembly. An elastomeric sheet 40 (e.g., silicone rubber) is placed on the top of each flexible circuit, covering bumps 18 and conductive traces 14. Each flexible circuit is then loaded in a sandwich-type arrangement between pressure plates 42 and 44. Moving plates 42 and 44 together laminates film 36 to the flexible circuit assembly and causes openings 20 and 32 to be filled in.

The completed flexible printed circuit product with bumps 18 formed in the contact pads is shown in FIG. 11.

Other embodiments are within the following claims.

Figure 12:
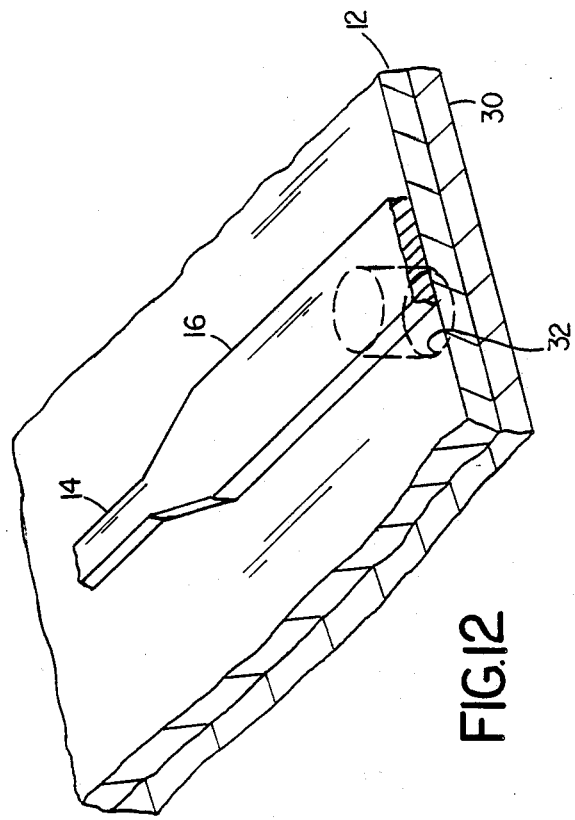

For example, as shown in FIG. 12, aperture 20 in dielectric substrate 12 may be smaller than the width of pad 16. In this case, the aperture may be backfilled following bump formation with solder or electroplated metal (e.g., copper).

Instead of a flexible printed circuit, the printed circuit may be a tape automated bonding (TAB) tape for use in multilayer TAB applications where bumps are needed on the circuit or on the chip.

We claim:

1. A process for forming a contact bump in an electrically conductive contact pad having top and bottom surfaces supported on a dielectric substrate comprising the steps of
    removing a portion of said substrate underlying said contact pad to form an aperture and thereby expose a portion of the bottom surface of said pad;
    upwardly deforming said pad by applying force to its exposed bottom surface to form said bump; and
    filling said aperture behind said bump with a supporting substance.

2. The process of claim 1 comprising removing said portion of said substrate by ablating with a laser.

3. The process of claim 1 wherein said deforming step comprises stamping the exposed bottom surface of said pad with a stamping die to form said bump.

4. The process of claim 1 wherein said filling step comprises dropping an adhesive dielectric material in said aperture in a manner to cause said adhesive dielectric material to fill said aperture.

5. The process of claim 1 wherein said filling step comprises dropping a non-adhesive dielectric material in said aperture in a manner to cause said non-adhesive dielectric material to fill said aperture.

6. The process of claim 1 wherein said aperture is large relative to the size of said contact pad, extends through the entire thickness of said substrate on either side of said pad, and is sufficient to accommodate an impact forming tool.

7. The process of claim 1 wherein said filling step comprises laminating an adhesive-coated cover film to said substrate into or over said aperture and causing said adhesive to flow into said aperture.

8. The process of claim 1 further comprising providing a patterned mask layer underneath said substrate for determining the location of said aperture.

9. A contact bump in an electrically conductive contact pad having top and bottom surfaces supported on a dielectric substrate prepared by
    removing a portion of said substrate underlying said contact pad to form an aperture and thereby expose a portion of the bottom surface of said pad;
    upwardly deforming said pad by applying force to its exposed bottom surface to form said bump; and
    filling said aperture behind said bump with a supporting substance.

10. A process for forming a contact bump in an electrically conductive contact pad having top and bottom surfaces supported on a dielectric substrate comprising the steps of
    removing by ablating with a laser a portion of said substrate underlying said contact pad to form an aperture and thereby expose a portion of the bottom surface of said pad, the difference in interaction between said substrate being removed and the substance of said pad enabling said ablation to leave said pad intact despite exposure to said laser;
    upwardly deforming said pad by applying force to its exposed bottom surface to form said bump; and
    filling said aperture behind said bump with a supporting substance.

11. A printed circuit comprising at least one printed circuit trace terminating in a metal pad supported upon a preformed substrate, in an intermediate portion of the pad said substrate defining an aperture over which said pad bridges, said pad having an outwardly extending bump form, and a supporting substance disposed within said aperture and adhered to the underside of said bump form-pad and the walls of the substrate bounding said aperture.

12. The printed circuit of claim 11 having a plurality of said pads, a single aperture in said substrate extending under said pads, and said supporting substance extending continuously under said pads, in supporting relationship to said plurality of bumps.

13. The printed circuit of claim II wherein said circuit is a flexible printed circuit.

14. The printed circuit of claim 12 wherein said circuit is a flexible printed circuit.

* * * * *